United States Patent
Fan et al.

(10) Patent No.: US 9,037,429 B2
(45) Date of Patent: May 19, 2015

(54) METHODS AND APPARATUS FOR MEASURING THE FUNDAMENTAL FREQUENCY OF A LINE SIGNAL

(75) Inventors: Chun Fan, Johns Creek, GA (US); Paul Terricciano, Roswell, GA (US)

(73) Assignee: Siemens Industry, Inc., Alpharetta, GA (US)

( * ) Notice: Subject to any disclaimer, the term of this patent is extended or adjusted under 35 U.S.C. 154(b) by 773 days.

(21) Appl. No.: 13/153,612

(22) Filed: Jun. 6, 2011

(65) Prior Publication Data

US 2012/0310569 A1 Dec. 6, 2012

(51) Int. Cl.
*G01R 23/15* (2006.01)
*G01R 19/25* (2006.01)

(52) U.S. Cl.
CPC ............ *G01R 23/15* (2013.01); *G01R 19/2513* (2013.01)

(58) Field of Classification Search
CPC ...... G01R 19/02; G01R 19/175; G01R 19/00; G01R 19/25; G01R 19/2513; G01R 23/15
USPC .......................................................... 702/64
See application file for complete search history.

(56) References Cited

U.S. PATENT DOCUMENTS

| | | | | |
|---|---|---|---|---|
| 4,319,329 A | * | 3/1982 | Girgis et al. | 702/75 |
| 4,928,251 A | * | 5/1990 | Marzalek et al. | 702/67 |
| 5,027,060 A | * | 6/1991 | Fraisse | 324/132 |
| 5,119,260 A | * | 6/1992 | Huhse et al. | 361/2 |
| 5,321,350 A | * | 6/1994 | Haas | 324/76.11 |
| 5,528,134 A | * | 6/1996 | Davis et al. | 324/76.24 |
| 5,932,998 A | * | 8/1999 | LaWhite | 324/76.42 |
| 6,279,115 B1 | * | 8/2001 | Baumgartl et al. | 713/300 |
| 2011/0080197 A1 | | 4/2011 | Fan | |

OTHER PUBLICATIONS

Mitra, S. K., "IIR Filter structures", 2005, pp. 1-33.*

* cited by examiner

*Primary Examiner* — Mischita Henson

(57) ABSTRACT

The present invention provides methods, apparatus, and systems of measuring frequency. The invention includes sampling a first number of full cycles of a signal at a rate based on a nominal frequency of the signal; converting the samples to digital samples; processing the digital samples to identify a first pair of digital samples with each one disposed on either side of a first zero-crossing and a second pair of digital samples with each one disposed on either side of a last full cycle zero-crossing; interpolating the first pair of digital samples and the second pair of digital samples to determine a position of the first and last zero-crossings relative to each other in time; and calculating a fundamental frequency of the signal based on the first number of full cycles sampled and the relative position of the first and last zero-crossings. Numerous additional aspects are disclosed.

13 Claims, 7 Drawing Sheets

METHODS AND APPARATUS FOR MEASURING THE FUNDAMENTAL FREQUENCY OF A LINE SIGNAL

FIELD OF THE INVENTION

The present invention is directed towards methods and apparatus for measuring the fundamental frequency of single-phase and poly-phase line signal. Further, using the measured frequency, the present invention also provides improved measurement accuracy of electrical characteristics of line signals.

BACKGROUND OF THE INVENTION

Conventional power line frequency measurement circuits rely on analog circuits to determine the frequency of a measured signal. For example, an analog circuit may be used to detect a beat frequency between a reference signal having a known frequency and the frequency of the signal being measured. The beat frequency represents the frequency difference between the reference signal and the measured signal. By adjusting the frequency of the reference signal to eliminate the beat frequency, the frequency of the measured signal can be determined. Other analog circuit measurement methods use a phase-locked loop to determine the frequency of line signals. These circuits can be complex and require relatively expensive components to achieve accurate measurements. Such components also tend to fail over time. What is needed is a more reliable and robust, low cost and simple but accurate method of determining the frequency of line signals.

SUMMARY OF THE INVENTION

The embodiments of the present invention generally relate to methods and apparatus for measuring the fundamental frequency of single-phase and poly-phase line signals.

In some embodiments, the present invention provides a method of measuring frequency. The method includes sampling a first number of full cycles of a signal at a rate based on a nominal frequency of the signal; converting the samples to digital samples; processing the digital samples to identify a first pair of digital samples with each one disposed on either side of a first zero-crossing and a second pair of digital samples with each one disposed on either side of a last full cycle zero-crossing; interpolating the first pair of digital samples and the second pair of digital samples to determine a position of the first and last zero-crossings relative to each other in time; and calculating a fundamental frequency of the signal based on the first number of full cycles sampled and the relative position of the first and last zero-crossings.

In some other embodiments, the present invention provides a circuit for measuring frequency. The circuit includes an analog to digital (A/D) converter adapted to sample a first number of full cycles of a signal at a rate based on a nominal frequency of the signal and adapted to converting the samples to digital samples; and a digital signal processor (DSP) coupled to the A/D converter and adapted to: process the digital samples to identify a first pair of digital samples with each one disposed on either side of a first zero-crossing and a second pair of digital samples with each one disposed on either side of a last full cycle zero-crossing, interpolate the first pair of digital samples and the second pair of digital samples to determine a position of the first and last zero-crossings relative to each other in time, and calculate a fundamental frequency of the signal based on the first number of full cycles sampled and the relative position of the first and last zero-crossings.

In yet other embodiments, the present invention provides a method to synchronize voltage sampling to power line fundamental frequency. The method includes sampling a first number of full cycles of a power line signal at a rate based on a nominal frequency of the power line; converting the samples to digital samples; processing the digital samples to identify a first pair of digital samples with each one disposed on either side of a first zero-crossing and a second pair of digital samples with each one disposed on either side of a last full cycle zero-crossing; interpolating the first pair of digital samples and the second pair of digital samples to determine a position of the first and last zero-crossings relative to each other in time; calculating a fundamental frequency of the signal based on the first number of full cycles sampled and the relative position of the first and last zero-crossings; and measuring at least one of voltage RMS and current RMS using a sampling rate based on the calculated fundamental frequency of the signal.

These and other features and aspects of the present invention will become more fully apparent from the following detailed description of exemplary embodiments, the appended claims and the accompanying drawings.

BRIEF DESCRIPTION OF THE DRAWINGS

An artisan of ordinary skill will understand that the drawings, described below, are for illustration purposes only. The drawings are not intended to limit the scope of the present teachings in any way.

DETAILED DESCRIPTION

Figure 1:
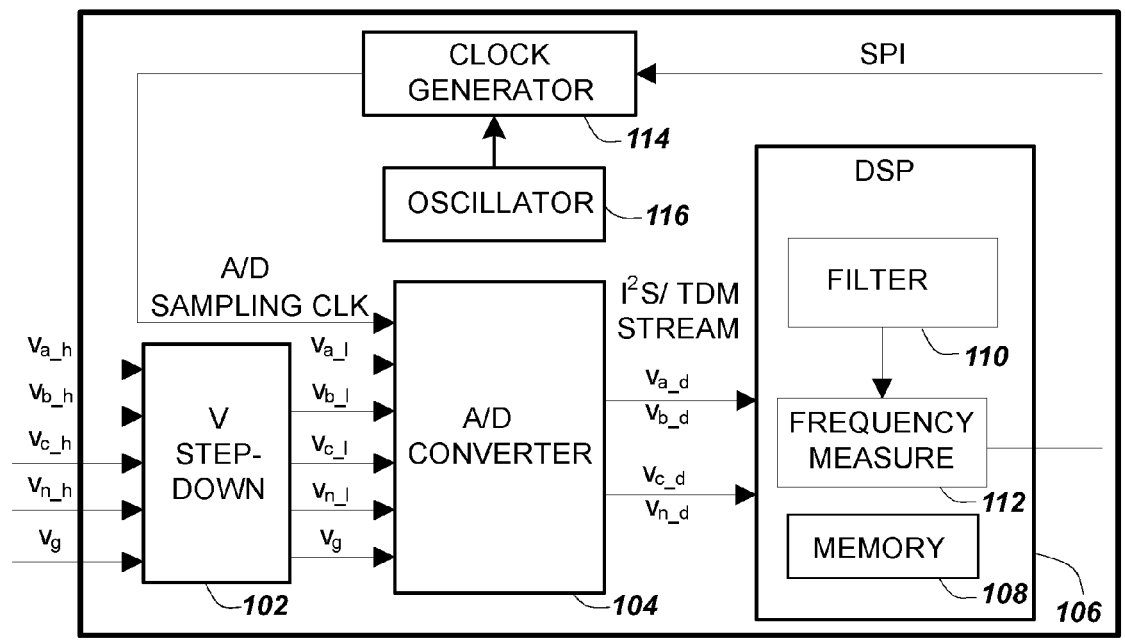
FIG. 1 is a block diagram of an example circuit embodiment of the present invention according to some aspects of the present invention.

For the purpose of interpreting this specification, whenever appropriate, terms used in the singular will also include the plural and vice versa. The use of "or" is intended to mean "and/or" unless stated otherwise. The use of "a" herein is intended to mean "one or more" unless stated otherwise or where the use of "one or more" is clearly inappropriate. The use of "comprise," "comprises," "comprising," "include," "includes," "including," "has," and "having" are interchangeable and not intended to be limiting. Furthermore, where the description of one or more embodiments uses the term "comprising," those of ordinary skill in the art would understand that, in some specific instances, the embodiment or embodiments can be alternatively described using the language "consisting essentially of" and/or "consisting of."

While the present teachings are described in conjunction with various embodiments, it is not intended that the present teachings be limited to such embodiments. On the contrary, the present teachings encompass various alternatives, modifications, and equivalents, as will be appreciated by those of ordinary skill in the art.

The present invention provides systems, methods, and apparatus for measuring the fundamental frequency of single-phase and poly-phase power line signals and other signals. The present invention also provides systems, methods, and apparatus to synchronize voltage and current sampling to power line frequency so that subsequent root mean square (RMS) or Digital Fourier Transform/Fast Fourier Transform (DFT/FFT) calculations are performed on data representing full power cycles to improve measurement accuracy of voltage RMS, current RMS, power, and energy. The present invention can be used to measure frequency accurate to at least within +/−0.01 Hz when averaged over a 10 second time frame. The present invention can also be used to synchronize voltage/current sampling to power line fundamental frequency so that DFT/FFT and RMS calculations may be performed on full cycles of data to ensure at least +/−0.1% measurement accuracy of voltage RMS and current RMS.

Instead of using a conventional phase-locked loop to measure power line frequency, the present invention uses a novel algorithm to measure fundamental line frequency accurately. The algorithm may be implemented, for example, on a digital signal processor (DSP). The algorithm may be implemented using a band pass filter, a novel interpolation method, and a full cycle zero-crossing counter.

The present invention samples a number of cycles of a signal assuming the frequency of the signal is the nominal frequency; converts the samples to digital values; optionally filters the digital samples; processes the filtered digital samples to identify the two samples on either side of the first zero-crossing and the two samples on either side of the last full cycle zero-crossing; uses linear interpolation to determine the position of the first and last zero-crossings relative to each other in time; and calculates the fundamental frequency based on the number of full cycles sampled and the relative position of the first and last zero-crossings. To further improve the accuracy, the method can be iteratively repeated, using the calculated fundamental frequency output as the nominal or assumed frequency input for each successive iteration.

Turning to FIG. 1, a block diagram depicting an example circuit 100 according to some embodiments of the present invention is shown. The circuit 100 can be installed as part of a power meter, a circuit breaker, a power line switch, or any other power control or monitoring device that can use accurate measurement of power line frequency. In the example shown, a voltage step down circuit 102 is used to reduce the line voltage to the voltage levels of the analog inputs of an analog to digital (A/D) converter 104. The voltage step down circuit 102 may also include isolation to protect the downstream digital circuits. Whether single phase or poly phase, such voltage step down circuits 102 are well known in the art as are incorporated isolation circuits. For example, a step-down circuit may include shunt resistors and the isolation circuit may include opto-isolators. The example in FIG. 1 depicts three phase voltage lines inputting analog AC voltage signals to the voltage step down circuit 102 which are output the A/D converter 104. The A/D converter 104 converts the analog input signals into digital signals. To improve noise immunity, differential analog signals provided to A/D analog inputs may be used. The digital signals outputted from the A/D converter 104 may be transferred in parallel format, integrated interchip sound ($I^2S$) format, time division multiplexing (TDM) format, or any practicable format. The A/D converter 104 may be a 16-bit successive approximation, sigma-delta, or any other practicable technology. An example of a commercially available chip that may be used as an A/D converter 104 in embodiments of the present invention is the model ADS1278 manufactured by Texas Instruments.

A digital signal processor (DSP) 106 with internal memory 108 and external memory (not shown) reads in the digital signals output by the A/D converter 104, stores samples in buffers in memory, and computes line to line (LL) and line to neutral (LN) voltages. The LL and LN voltages can be stored in either integer or floating point format. The present invention may be implemented using, for example, a commercially available DSP such as model number TMS320C6713B manufactured by Texas Instruments (TI).

In some embodiments, a LL or a LN voltage may be chosen as a reference channel. A digital filter 110 (e.g., a band pass filter) implemented within the DSP 106 may be applied to the voltage signal of the reference channel to remove noise. Fundamental power line frequency $f_m$ may then be determined based on the filtered voltage signal. In some embodiments, a programmed frequency measurement module 112 implemented within the DSP 106 and coupled to the output of the filter 110 may be used to determine the fundamental power line frequency $f_m$. The DSP 106 may adjust output clock frequency of a clock generator 114 based on $f_m$ so that the sampling clock of the A/D converter 104 (which may be coupled to the output of the clock generator 114) is continuously synchronized with line frequency. This results in a fixed number of samples for every fundamental power cycle. For example, if $f_m$ is 60 Hz, a sampling clock of 7.68 kHz will result in 128 samples per fundamental cycle. If $f_m$ changes to 65 Hz, the sampling clock will be changed to 8.32 kHz so that there are still 128 samples per fundamental cycle. The clock generator 114 may be a commercially available programmable phase locked loop (PLL) clock generator such as, for example, a model CDCE913 clock generator manufactured by Texas Instruments and an oscillator 116 (e.g., a crystal oscillator). In some embodiments, the DSP 106 may be adapted to set parameters within the clock generator 114 via a predefined interface such the serial port interface (SPI) implemented in both the TI TMS320C6713B and the TI CDCE913.

Figure 2:
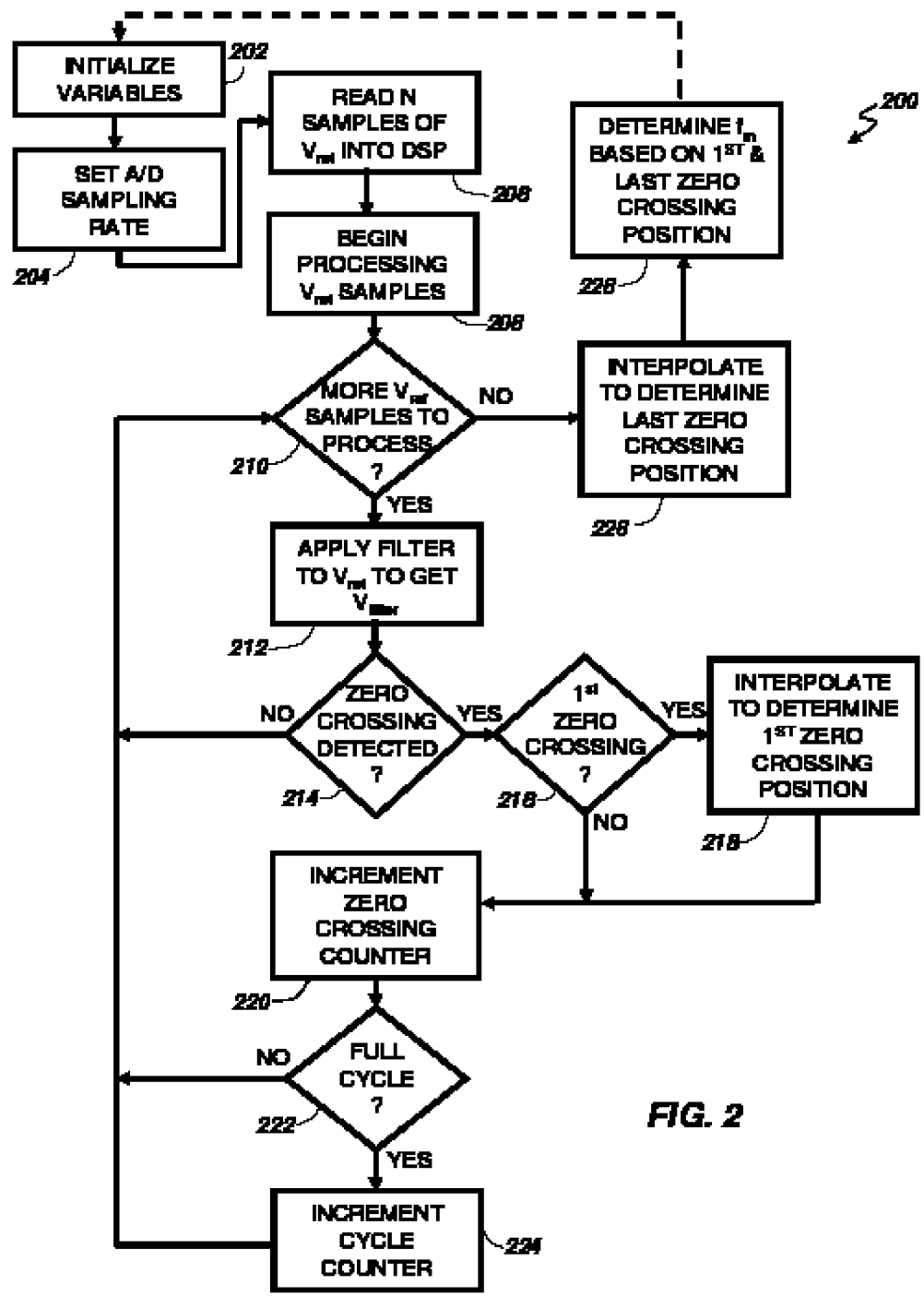
FIG. 2 is a flow chart depicting an example method embodiment of the present invention according to some aspects of the present invention.

Turning now to FIG. 2, a flowchart depicting an example method 200 according to embodiments of the present invention is discussed. The method 200 begins at Step 202 with initializing various variables and counters, for example, the number of samples per cycle "n" and measured frequency "$f_m$". Samples per cycle, n, can be set to any practicable number, for example 64 or 128 samples per cycle. Measured frequency, $f_m$, may initially be set to the nominal frequency, $f_{nom}$, for the line signal to be measured. In the US, 60 Hz is the nominal frequency of the power network and in the EU, 50 Hz is the nominal frequency. Counters are initialized to zero. Since there are no significant differences among fundamental frequencies of voltage channels of a poly-phase public power network, frequency may be measured on any one of the voltage channels. The selected channel is called $v_{ref}$. A user may also select to use either a LL voltage or a LN voltage. In Step 204, the A/D converter 104 sampling frequency, $f_{ad}$, is adjusted to $f_{ad}=n\times f_m$. In Step 206, the DSP 106 reads in N samples of $v_{ref}$, where N is an integer multiple of n, such as N=640 when n=64. When the sampling is synchronized to the line frequency, integer "m" will be the number of full cycles where m=N/n. In Step 208, the method 200 begins to loop through the $v_{ref}$ samples.

At Step 210, the method 200 determines if there are any additional $v_{ref}$ samples to process. If so, flow continues to Step 212, where the next sample is filtered. Otherwise, flow continues to Step 226 which is discussed below.

In Step 212, a filter may optionally be used to eliminate noise mixed in with the line signal. For example, fundamental voltage frequencies of public power networks are typically within the range from 40 Hz to 70 Hz so, in some embodiments, the $V_{ref}$ samples may be put through a band pass filter to remove any frequencies outside this range to generate $V_{fltr}$ samples. The band pass filter may be designed to have, for example, a center frequency $f_c$ of 55 Hz and a bandwidth BW of 50 Hz. The band pass filter may optionally be implemented to minimize the amount of delays used, for example by using a Direct Form II realization of the transfer function. The equations below represent an example band pass filter suitable for use with some embodiments of the present invention:

$$v_{fltr}(i) = b_0 w(i) + b_1 w(i-1) + b_2 w(i-2),$$

Where $$w(i) = v_{ref}(i) + a_1 w(i-1) + a_2 w(i-2),$$

$$b_0 = 1 - S,$$

$$b_1 = 2(S - R)\cos(2\pi f_{c\_nom}),$$

$$b_2 = R^2 - S,$$

$$a_1 = 2R \cos(2\pi f_{c\_nom}),$$

$$a_2 = -R^2,$$

$$R = 1 - 3 \times BW_{nom},$$

$$S = \frac{1 - 2R \cos(2\pi f_{c\_nom}) + R^2}{2 - 2\cos(2\pi f_{c\_nom})},$$

$$f_{c\_nom} = \frac{f_c}{f_s},$$

$$BW_{nom} = \frac{BW}{f_s},$$

$$f_s = n \times f_c,$$

w(i−1) and w(i−2) are intermediate variables called delays and are initialized to zero. The coefficients of the chosen band pass filter are constants, which may be pre-calculated and stored in the DSP memory 108. More details of the optional filtering Step 212 are discussed below with respect to FIGS. 3 and 4. The resulting $V_{fltr}$ sample is passed on for further processing.

In Step 214, the method 200 determines if the signal has crossed the zero volts level. Sign changes and zero points are identified in $V_{fltr}$ samples by checking if the products of $v_{fltr}(i) \times v_{fltr}(i-1)$ are less than or equal to zero where $v_{fltr}(i)$ refers to the current sample and $v_{fltr}(i-1)$ refers to the prior sample. Thus, if the products of $v_{fltr}(i) \times v_{fltr}(i-1)$ are less than or equal to zero, a zero-crossing exists between the current and prior sample and flow continues to Step 216. Otherwise, if the products of $v_{fltr}(i) \times v_{fltr}(i-1)$ are greater than zero, the zero voltage level has not been crossed and flow loops back to Step 210 to process the next sample, if one exists.

In Step 216, the method 200 determines if the zero-crossing is the first zero-crossing encountered in the data samples. A simple zero-crossing counter, k, may be used to track the number of zero-crossing that have been identified in the data samples. Thus, for example, if k=0, then the system may determine that the current zero-crossing is the first zero-crossing in which case, flow continues to Step 218. Otherwise, if k does not equal zero, flow continues to Step 220 where the zero-crossing counter k is incremented.

In Step 218, the position of the zero-crossing is determined. Because zero crossings can fall between $v_{fltr}(i)$ and $v_{fltr}(i-1)$, the actual zero crossing indexes $ZC_{indx}$ may be derived by linear interpolation and are floating numbers between i and i−1.
If $$v_{fltr}(i) \times v_{fltr}(i-1) \leq 0,$$

then a zero-crossing exists between $v_{fltr}(i)$ and $v_{fltr}(i-1)$, and the first zero-crossing position may be determined based on:

$$ZC_{indx} = i + \frac{v_{fltr}(i)}{v_{fltr}(i-1) - v_{fltr}(i)}$$

Flow continues to Step 220 where the zero-crossing counter k is incremented.

Next, in Step 222, the method 200 determines if a full cycle (i.e., a full cycle of the AC voltage signal) has occurred. When there are harmonics presented in AC voltage signals, frequencies measured on an odd number of half cycles are not accurate. Therefore, the inaccuracies can be avoided by measuring frequencies on full cycles. The relationship between the number of zero-crossings $NUM_{zc}$ and number of full cycles $NUM_{fc}$ may be expressed as:

$$NUM_{zc} = 2 \times NUM_{fc} + 1$$

Thus, $NUM_{zc}$ is an odd number for full cycles of data. Therefore, in Step 222, the zero-crossing counter k is checked to see if it holds an odd value to insure that frequencies are measured on full cycles. If k is odd in Step 222, then flow continues to Step 224 where a full cycle counter, fcZcCnt, is incremented. Otherwise, if k is not odd, the current zero-crossing is at a half cycle point and flow returns to Step 210 to process the next sample, if one exists, without incrementing the full cycle counter.

After looping through all the samples, flow continues from Step 210 to Step 226 where the last zero-crossing position is determined. As with the first zero-crossing position, the last zero-crossing position is linearly interpolated based on:

$$ZC_{indx} = i + \frac{v_{fltr}(i)}{v_{fltr}(i-1) - v_{fltr}(i)}$$

Flow continues to Step 228 where the fundamental frequency $f_m$ is determined based on the number of full cycles, the position in time of the first zero-crossing and the position in time of the last zero-crossing:

$$f_m = \frac{(fcZcCnt - 1) \times f_{ad}}{2 \times (ZC_{last} - ZC_{first})}.$$

Where fcZcCnt represents the full cycle zero-crossing counter and is always an odd number.

To improve the accuracy of the method 200 further, the process may be repeated using the above-calculated value of the fundamental frequency $f_m$ to adjust the A/D converter 104 sampling rate instead of using the nominal frequency. As indicated by the dashed line connecting Step 228 with Step 202, the method 200 may be repeated iteratively in this manner to determine increasingly more accurate results. However, as shown below, after just two iterations, the accuracy of the present invention exceeds prior art methods by at least an order of magnitude. Please see the experimental results discussed below with respect to FIGS. 5 and 6.

Thus, after the fundamental power line frequency is measured, the DSP 106 can set a multiplier and a divider in the programmable PLL clock generator 114 so that the clock generator 114 will output a clock with the desired frequency that will yield an A/D sampling clock of $f_{adj}$ for the next iteration of the method 200. As mentioned above, the programmable PLL clock generator 114 can be implemented, for example, using a TI CDCE913. Also as mentioned, the DSP 106 (e.g., a TI TMS320C6713B chip) can be used to set parameters of the TI CDCE913 clock generator 114 through their mutual serial port interface (SPI).

Figure 3:
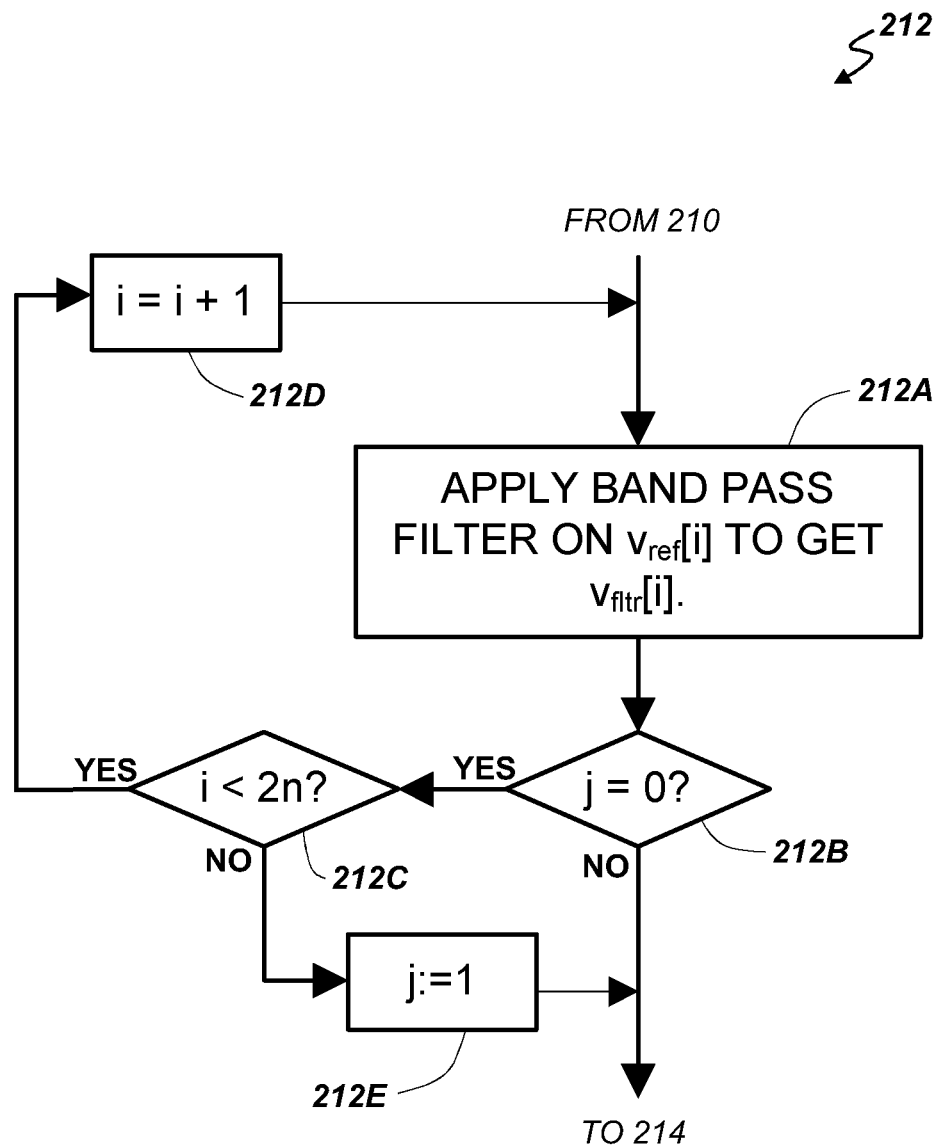
FIG. 3 is a flow chart depicting details of an example embodiment of a portion of the flow chart of FIG. 2 according to some aspects of the present invention.
Figure 4:
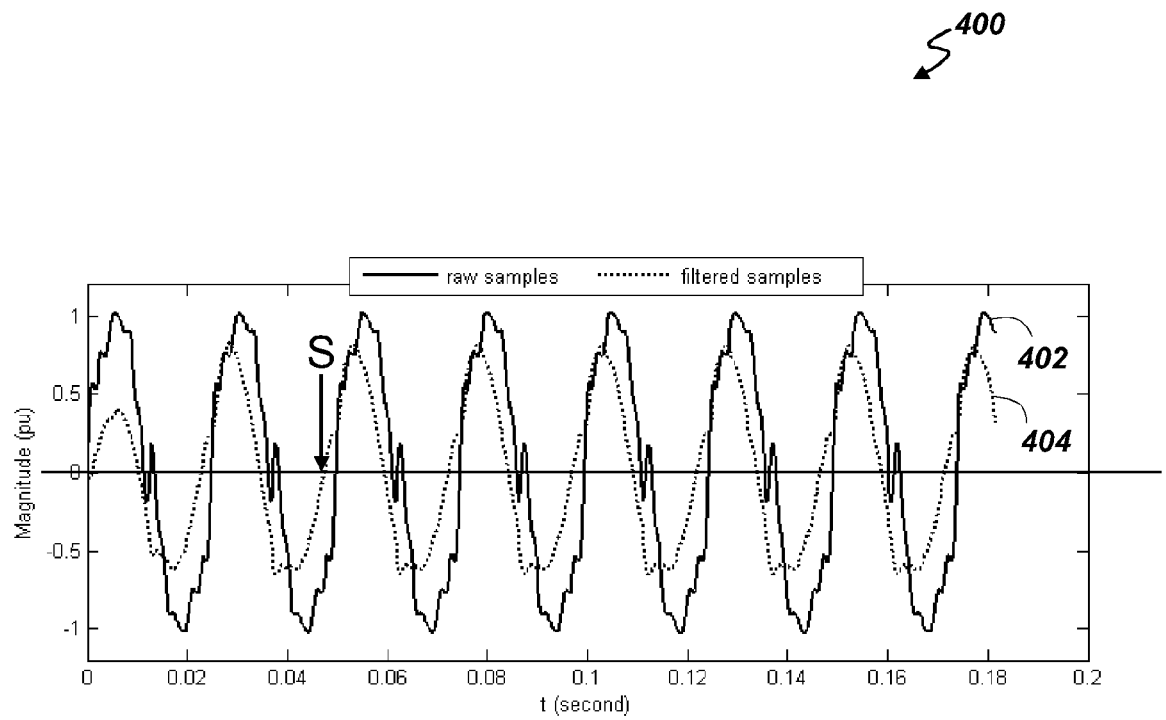
FIG. 4 is an example graph depicting the settling time of an example embodiment of a band pass filter that may be used in some embodiments of the present invention.

Turning now to FIGS. 3 and 4, Step 212 of FIG. 2 is discussed in more detail. As can be seen from the graph 400 in FIG. 4, the filter 110 may not immediately "settle." In FIG. 4, the solid plotted curve 402 represents the raw samples and the filtered samples are represented by the dotted plotted curve 404. Note that the filtered samples 402 do not achieve a regular, consistent, and repeating settled signal pattern until after the second full cycle at approximately the point labeled S. Thus, in order to eliminate any error caused by the filter 110 settling time, the method 200 of the present invention may skip (i.e., not consider) some initial cycles of data in determining the frequency of the signal.

As shown in FIG. 3, after the filter 110 is applied to $v_{ref}[i]$ in Step 212A, a flag j (set to zero at initialization, e.g., at Step 202) may be checked in Step 212B to determine if the initial, unsettled data samples have been skipped yet. If these cycles have been skipped, flow continues onto Step 214 described above with respect to FIG. 2. If the initial, unsettled data samples have not been skipped yet, flow continues to Step 212C.

At Step 212C, the method 200 checks to determine if an appropriate number of cycles have been skipped. In the example, if the index i used to index the data samples is less that or equal to two times the number n of samples per cycle (i.e., the current data sample represents the first or second cycle), then flow continues to Step 212D where the index i is incremented and the next sample is filtered in Step 212A. If however, the index used to index the data samples is greater than two times the number n of samples per cycle (i.e., the current data sample represents the third or greater cycle) in Step 212C, then flow continues to Step 212E where flag j is set to 1 indicating the initial, unsettled data samples have been skipped. Flow then proceeds to Step 214 in FIG. 2. Note that in the example, two cycles were chosen to be skipped based on the experimental data shown in FIG. 4 derived using the example circuit 100, example DSP 106, and example filter 110. In other alternative embodiments, 0, 1, 3 or more cycles may be skipped to accommodate the settling time or other factors of the filter 110.

Experimental Results

Figure 5:
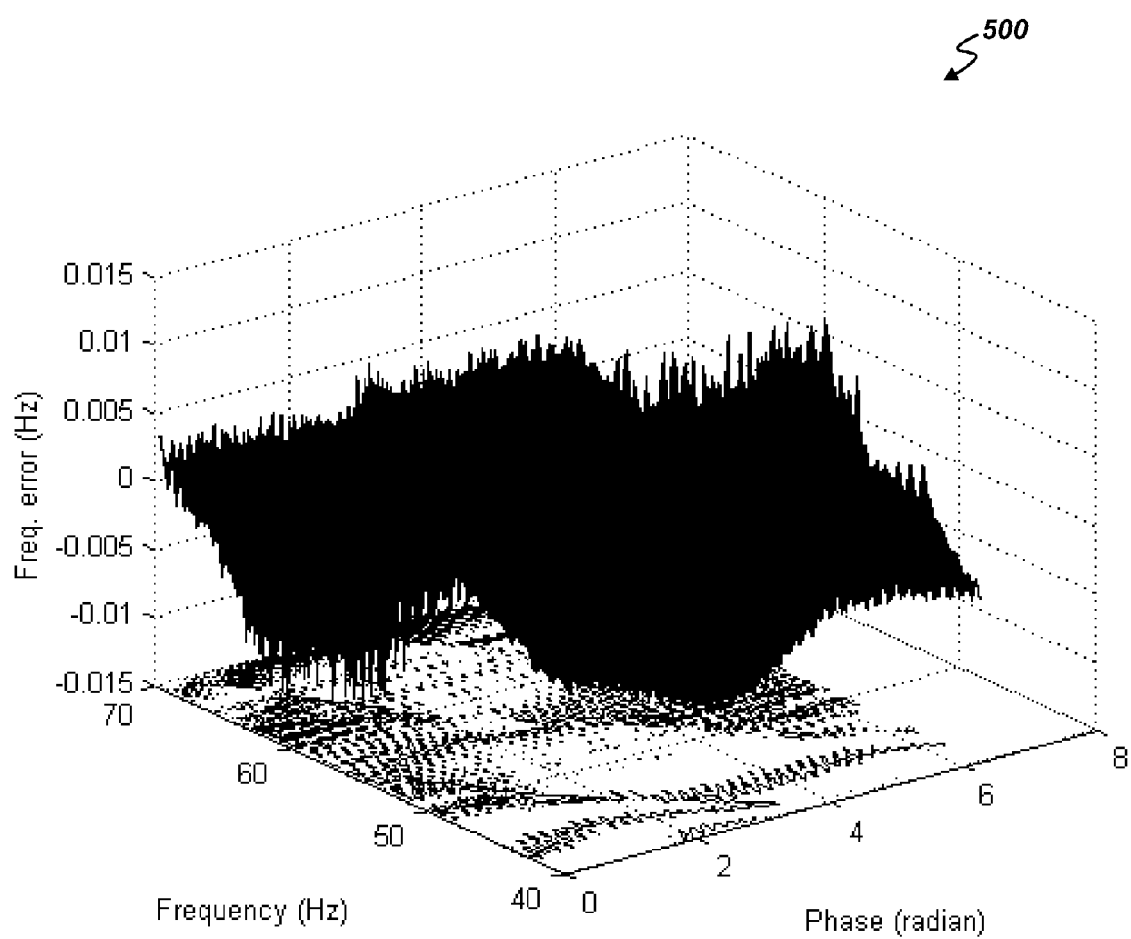
FIG. 5 is a graph depicting example test results of a first iteration of an embodiment of the present invention.
Figure 6:
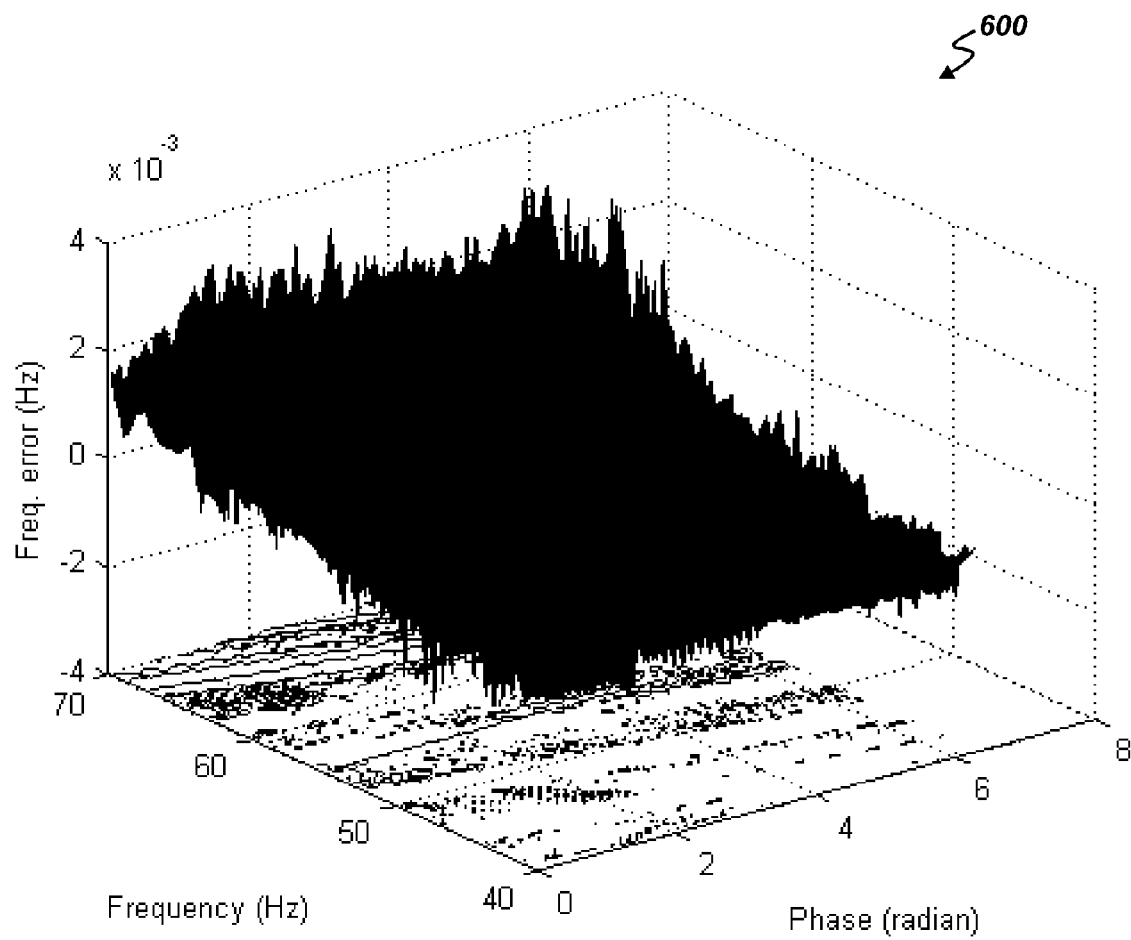
FIG. 6 is a graph depicting example test results of a second iteration of an embodiment of the present invention.

The present invention may be tested using sinusoidal signals of different frequencies, different phases, and different harmonic content. For example, the method 200 and example circuit 100 described above were tested using 100 frequencies uniformly distributed between 40 Hz and 70 Hz and 100 phases uniformly distributed between 0 and $2\pi$. Combining the different frequencies and phases results in 100×100=10,000 test signals. Odd, even, and/or inter harmonics are also added to the signals. $f_m$ is initially set to 55 Hz. n, the number of samples per cycle is set to 64 and N, the number of samples for one iteration is set to 640. The three-axis graph 500 shown in FIG. 5 summarizes the frequency measurement errors for the 10,000 test signals after the first iteration. For all 10,000 test signals it can be seen from the graph 500 in FIG. 5 that after the first iteration, frequency measurement errors are within ±0.015 Hz. The three-axis graph 600 shown in FIG. 6 summarizes the errors after the second iteration. Again, for all 10,000 test signals, it can be seen from the graph 600 in FIG. 6 that after the second iteration, the frequency measurement errors are within ±0.004 Hz.

There are 2×640=1280 total samples and 1280/64=20 cycles in two iterations. Twenty cycles take 333.33 ms for 60 Hz power and take 500 ms for 40 Hz power. Therefore, the method 200 of the present invention achieves ±0.004 Hz accuracy in less than or equal to 0.5 s. The International Electrotechnical Commission's standard for frequency measurement equipment, IEC 61000-4-30, requires ±0.01 Hz accuracy on frequency measurement over ten seconds worth of data. Thus, the systems and methods of the present invention allow measurement accuracy that far exceeds the IEC requirement.

As shown above, using the filter, the interpolation method, and the full cycle zero-crossing counter described herein, the present invention can accurately measure voltage fundamental frequency even when there are zero crossing jitters caused by noise, harmonics, or inter-harmonics. The method 200 is computationally efficient because during the m power cycles, only the positions of the first and last zero-crossings are calculated and the positions of the intermediate zero-crossings are not needed.

Alternative Embodiment

Figure 7:
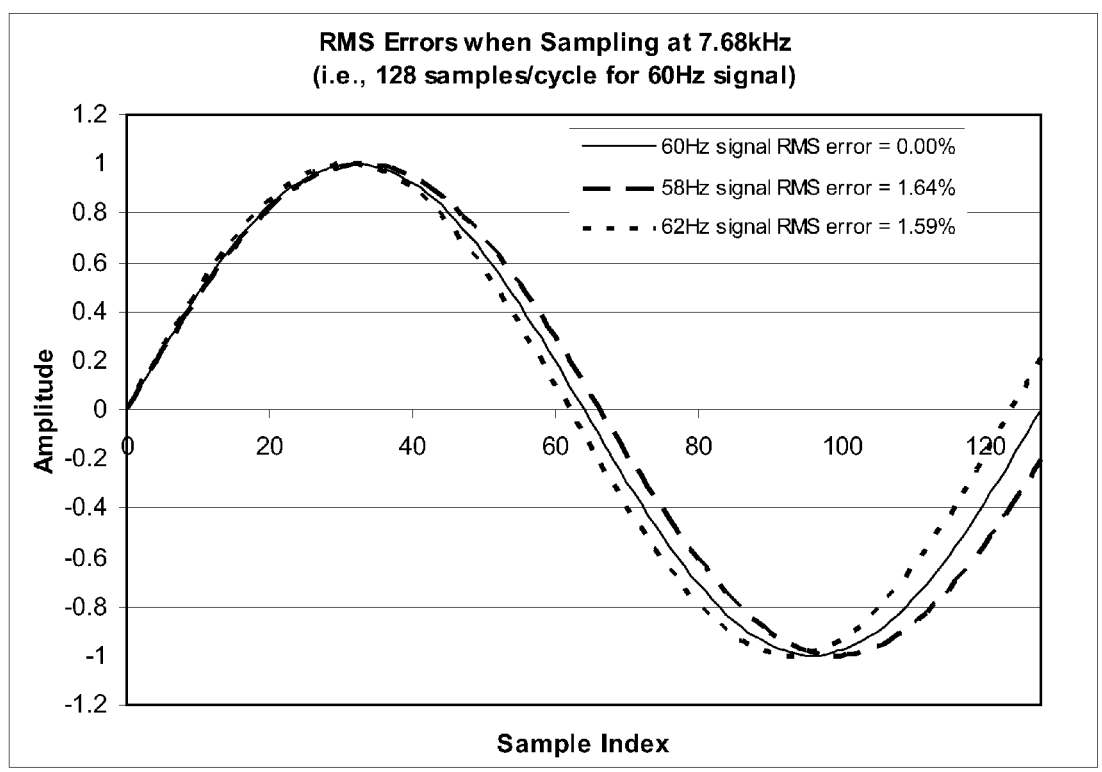
FIG. 7 is a graph depicting errors that may result from measuring less than a full cycle of a signal sample.

In another aspect of the present invention, measurement of voltage root mean square (RMS) and current RMS may be improved by using the disclosed improved fundamental frequency measurement to better synchronize A/D sampling. Voltage RMS and current RMS can be measured accurately when full cycles of samples are measured. As shown in the graph 700 of FIG. 7, if the sampling clock is fixed at 7.68 kHz, i.e., 128 samples/cycle for 60 Hz power, when line frequency changes to 62 Hz, 128 samples will result in more than 1 cycle. When line frequency changes to 58 Hz, 128 samples will result in less than 1 cycle. The error of a RMS measurement is zero when sampling clock is 7.68 kHz and power line frequency is 60 Hz. However, RMS. errors are significantly greater than 0.1% when the A/D sampling clock rate is 7.68 kHz and power line frequency is at 58 Hz or 62 Hz. Therefore, the calculation of RMS. voltage or current using signals containing partial cycles will result in significant errors.

The use of partial cycles also introduces significant errors into the results of discrete Fourier transform (DFT) and fast Fourier transform (FFT) calculations. To accurately calculate DFTs and FFTs, synchronizing the A/D sampling clock with the fundamental line frequency so that DFT/FFT calculations are performed using full cycles is desirable.

As suggested, instead of using the nominal frequency to set the A/D sampling rate when measuring voltage RMS, current RMS, calculating DFTs, or calculating FFTs, the present invention instead first determines the fundamental power line frequency using the method 200 and circuit 100 described above. Then a sampling clock signal generated based on the determined fundamental power line frequency is supplied to the A/D converter used to sample the power line for measuring voltage RMS, current RMS, calculating DFTs, or calculating FFTs. As with the example circuit 100, after the fundamental power line frequency is measured, the DSP 106 can set a multiplier and a divider in the programmable PLL clock generator 114 so that the clock generator 114 will output a clock with the desired frequency that will yield an A/D sampling clock of $f_{adj}$ for the RMS or DFT/FFT measurement/calculation. As above, the programmable PLL clock generator 114 can be implemented, for example, using a TI CDCE913. Also as above, the DSP 106 (e.g., a TI TMS320C6713B chip) can be used to set parameters of the TI CDCE913 clock generator 114 through their mutual serial port interface (SPI).

Embodiments of the teachings of the present invention have been described in an illustrative manner. It is to be understood that the terminology, which has been used, is intended to be in the nature of words of description rather than of limitation. Many modifications and variations of the embodiments are possible in light of the above teachings. Therefore, within the scope of the appended claims, the embodiments can be practiced other than as specifically described.

What is claimed is:

1. A method of providing circuit breaker protection comprising:
   providing a circuit breaker including a measurement circuit wherein the circuit breaker is responsive to the measurement circuit;
   sampling a first number of full cycles of a signal at a rate based on a nominal frequency of the signal;
   converting the samples to a first set of digital samples using an analog to digital (A/D) converter within the measurement circuit;
   processing the first set of digital samples using a digital signal processor (DSP) within the measurement circuit to identify a first pair of digital samples with each one disposed on either side of a first zero-crossing and a second pair of digital samples with each one disposed on either side of a last full cycle zero-crossing;
   interpolating the first pair of digital samples and the second pair of digital samples using the DSP within the measurement circuit to determine a position of the first and last zero-crossings relative to each other in time;
   calculating a preliminary fundamental frequency of the signal using the DSP within the measurement circuit based on the first number of full cycles sampled and the relative position of the first and last zero-crossings;
   sampling a second number of full cycles of a signal at a rate based on the calculated preliminary fundamental frequency of the signal;
   converting the samples to a second set of digital samples;
   processing the second set of digital samples to identify a third pair of digital samples with each one disposed on either side of a third zero-crossing and a fourth pair of digital samples with each one disposed on either side of a final full cycle zero-crossing;
   interpolating the third pair of digital samples and the fourth pair of digital samples to determine a position of the third and final zero-crossings relative to each other in time; and
   calculating a final fundamental frequency of the signal based on the second number of full cycles sampled and the relative position of the third and final zero-crossings; and
   measuring at least one of voltage RMS and current RMS using a sampling rate based on the calculated final fundamental frequency of the signal to tell if there is at least one of an overload and a short circuit condition within the circuit breaker.

2. The method of claim 1 further comprising filtering the digital samples before the step of processing the digital samples.

3. The method of claim 2 wherein filtering the digital samples includes applying a band pass filter to a subset of the sampled digital samples determined based upon a settling time of the band pass filter.

4. The method of claim 3 wherein applying a band pass filter includes applying a direct form II realization of a band pass filter.

5. The method of claim 1 wherein interpolating the first pair of digital samples and the second pair of digital samples includes linearly interpolating the pairs of digital samples.

6. The method of claim 1 wherein interpolating the first pair of digital samples includes computing a zero-crossing position based upon the following equation:

$$ZC = i + \frac{v(i)}{v(i-1) - v(i)}$$

wherein ZC represents the zero crossing position in time; i represents an index number of the digital samples; v(i) represents a voltage of a digital sample disposed immediately after the zero crossing position; and v(i−1) represents a voltage of a digital sample disposed immediately before the zero crossing position.

7. A circuit breaker comprising:
   a circuit breaker including a measurement circuit wherein the circuit breaker is responsive to the measurement circuit, wherein the measurement circuit includes:
   an analog to digital (A/D) converter adapted to sample a first number of full cycles of a signal at a rate based on a nominal frequency of the signal and adapted to converting the samples to a first set of digital samples; and
   a digital signal processor (DSP) coupled to the A/D converter and adapted to:
   process the first set of digital samples to identify a first pair of digital samples with each one disposed on either side of a first zero-crossing and a second pair of digital samples with each one disposed on either side of a last full cycle zero-crossing,
   interpolate the first pair of digital samples and the second pair of digital samples to determine a position of the first and last zero-crossings relative to each other in time, and
   calculate a preliminary fundamental frequency of the signal based on the first number of full cycles sampled and the relative position of the first and last zero-crossings;
   wherein the A/D converter is further adapted to:
   sample a second number of full cycles of the signal at a rate based on the calculated preliminary fundamental frequency of the signal; and
   convert the samples to a second set of digital samples;
   wherein the DSP is further adapted to:
   process the second set of digital samples to identify a third pair of digital samples with each one disposed on either side of a third zero-crossing and a fourth pair of digital samples with each one disposed on either side of a final full cycle zero-crossing;
   interpolate the third pair of digital samples and the fourth pair of digital samples to determine a position of the third and final zero-crossings relative to each other in time;
   calculate a final fundamental frequency of the signal based on the second number of full cycles sampled and the relative position of the third and final zero-crossings; and measure at least one of voltage RMS and current RMS using a sampling rate based on the calculated final fundamental frequency of the signal to tell if there is at least one of an overload and a short circuit condition within the circuit breaker.

8. The circuit of claim 7 wherein the DSP includes a filter adapted to filter the digital samples before the DSP processes the digital samples.

9. The circuit of claim 8 wherein the filter is a band pass filter adapted to be applied to a subset of the sampled digital samples determined based upon a settling time of the band pass filter.

10. The circuit of claim 8 wherein the filter is a direct form II realization of a filter.

11. The circuit of claim 7 wherein the DSP is adapted to interpolate the first pair of digital samples and the second pair of digital samples using linear interpolation of the pairs of digital samples.

12. The circuit of claim 7 wherein the DSP is adapted to interpolate the first pair of digital samples by computing a zero-crossing position based upon the following equation:

$$ZC = i + \frac{v(i)}{v(i-1) - v(i)}$$

wherein ZC represents the zero crossing position in time; i represents an index number of the digital samples; v(i) represents a voltage of a digital sample disposed immediately after the zero crossing position; and v(i−1) represents a voltage of a digital sample disposed immediately before the zero crossing position.

13. A circuit comprising:
a processor;
a memory coupled to the processor and operative to store instructions executable on the processor to:
control a circuit breaker including a measurement circuit wherein the circuit breaker is responsive to the measurement circuit;
sample a first number of full cycles of a signal at a rate based on a nominal frequency of the signal;
convert the samples to a first set of digital samples using an analog to digital (A/D) converter within the measurement circuit;
process the first set of digital samples using a digital signal processor (DSP) within the measurement circuit to identify a first pair of digital samples with each one disposed on either side of a first zero-crossing and a second pair of digital samples with each one disposed on either side of a last full cycle zero-crossing;
interpolate the first pair of digital samples and the second pair of digital samples using the DSP within the measurement circuit to determine a position of the first and last zero-crossings relative to each other in time;
calculate a fundamental frequency of the signal using the DSP within the measurement circuit based on the first number of full cycles sampled and the relative position of the first and last zero-crossings;
sample a second number of full cycles of a signal at a rate based on the calculated fundamental frequency of the signal;
convert the samples to a second set of digital samples;
process the second set of digital samples to identify a third pair of digital samples with each one disposed on either side of a third zero-crossing and a fourth pair of digital samples with each one disposed on either side of a final full cycle zero-crossing;
interpolate the third pair of digital samples and the fourth pair of digital samples to determine a position of the third and final zero-crossings relative to each other in time;
calculate a final fundamental frequency of the signal based on the second number of full cycles sampled and the relative position of the third and final zero-crossings; and
measure at least one of voltage RMS and current RMS using a sampling rate based on the calculated final fundamental frequency of the signal to tell if there is
at least one of an overload and a short circuit condition within the circuit breaker.

* * * * *